(12) United States Patent
Simpson et al.

(10) Patent No.: US 10,912,185 B2
(45) Date of Patent: Feb. 2, 2021

(54) LOW-COST SUPERIOR PERFORMANCE COINLESS RF POWER AMPLIFIER

(71) Applicants: Reginald Simpson, Ottawa (CA); Ronald Nehring, Stittsville (CA); Mokhtar Rouabhi, Ottawa (CA)

(72) Inventors: Reginald Simpson, Ottawa (CA); Ronald Nehring, Stittsville (CA); Mokhtar Rouabhi, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/526,861

(22) PCT Filed: Jun. 16, 2016

(86) PCT No.: PCT/IB2016/053590
§ 371 (c)(1),
(2) Date: May 15, 2017

(87) PCT Pub. No.: WO2016/207764
PCT Pub. Date: Dec. 29, 2016

(65) Prior Publication Data
US 2017/0374731 A1 Dec. 28, 2017

Related U.S. Application Data

(60) Provisional application No. 62/182,919, filed on Jun. 22, 2015.

(51) Int. Cl.
*H05K 1/02* (2006.01)
*H03F 1/30* (2006.01)
(Continued)

(52) U.S. Cl.
CPC ......... *H05K 1/0203* (2013.01); *H01L 23/66* (2013.01); *H03F 1/30* (2013.01); *H03F 3/195* (2013.01);
(Continued)

(58) Field of Classification Search
CPC ..... H01L 21/4871; H01L 23/34; H01L 23/36; H01L 23/40; H01L 2023/4037;
(Continued)

(56) References Cited

U.S. PATENT DOCUMENTS 3,303,265 A * 2/1967 Noren ................... H01L 23/057
174/50.54
3,609,480 A 9/1971 Gerstner
(Continued)

FOREIGN PATENT DOCUMENTS

| CN | 103887339 A | 6/2014 |
|---|---|---|
| DE | 1914442 | 1/1971 |
| EP | 2518766 A2 | 10/2012 |

OTHER PUBLICATIONS

Zimer, Rene, International Search Report, PCT/IB2016/053590, European Patent Office, P.B. 5818 Patentlaan 2 NL-2280 HV Rijswijk, Sep. 13, 2016.
(Continued)

*Primary Examiner* — Galina G Yushina
(74) *Attorney, Agent, or Firm* — Withrow & Terranova, PLLC (57) ABSTRACT

Power amplifier assemblies and components are disclosed. According to some embodiments, a power amplifier assembly (10) is provided that includes a power amplifier (12) having a gate lead (14), a drain lead (13) and a source contact surface (15). An extended heat slug (11) is mounted against the source contact surface to conduct heat away (18) from the surface and to extend the electrical path of the
(Continued)

source. The extended heat slug has at least a length that is greater than the length of the source contact surface.

18 Claims, 6 Drawing Sheets

(51) Int. Cl.
  *H03F 3/195* (2006.01)
  *H03F 3/213* (2006.01)
  *H05K 3/32* (2006.01)
  *H01L 23/66* (2006.01)
  *H05K 3/34* (2006.01)

(52) U.S. Cl.
  CPC .......... *H03F 3/213* (2013.01); *H05K 1/0243* (2013.01); *H05K 3/325* (2013.01); *H01L 2223/6644* (2013.01); *H03F 2200/451* (2013.01); *H05K 3/3405* (2013.01); *H05K 2201/1034* (2013.01); *H05K 2201/10166* (2013.01); *H05K 2201/10386* (2013.01); *H05K 2201/10446* (2013.01); *H05K 2201/10628* (2013.01); *H05K 2201/10689* (2013.01); *H05K 2201/10818* (2013.01); *H05K 2201/10969* (2013.01)

(58) Field of Classification Search
  CPC ............ H01L 2023/405; H01L 31/024; H05K 1/0203; H05K 1/0243; H05K 2201/10166; H05K 1/0272; H03F 3/213; H03F 3/195; H03F 1/30; H03F 2200/451; H03F 3/20; H03F 3/3001
  See application file for complete search history.

(56) References Cited

U.S. PATENT DOCUMENTS

| | | | |
|---|---|---|---|
| 3,864,727 A | | 2/1975 | Schoberl |
| 5,877,555 A | | 3/1999 | Leighton |
| 5,933,327 A | * | 8/1999 | Leighton ............. H01L 23/3677 257/785 |
| 7,446,411 B2 | | 11/2008 | Condie |
| 7,458,826 B1 | | 12/2008 | Maatta |
| 2003/0207600 A1 | | 11/2003 | Ho |
| 2006/0234530 A1 | | 10/2006 | Chung |
| 2007/0051877 A1 | | 3/2007 | Sakai et al. |
| 2008/0019108 A1 | * | 1/2008 | Hoyer ................. H01L 23/3675 361/760 |
| 2013/0067736 A1 | | 3/2013 | Peng et al. |
| 2013/0075893 A1 | * | 3/2013 | Herbsommer .......... H01L 24/05 257/737 |
| 2014/0070365 A1 | * | 3/2014 | Viswanathan ........ H01L 23/047 257/531 |
| 2015/0002226 A1 | * | 1/2015 | Meen Kuo .............. H01L 24/85 330/295 |
| 2015/0348867 A1 | * | 12/2015 | Wang ..................... H01L 23/38 361/719 |
| 2017/0230011 A1 | | 8/2017 | Patel et al. |
| 2017/0374731 A1 | * | 12/2017 | Simpson .............. H05K 1/0203 |
| 2018/0310416 A1 | | 10/2018 | Nehring et al. |

OTHER PUBLICATIONS

Examination Report for European Patent Application No. 16732762.6, dated Apr. 18, 2018, 8 pages.
Non-Final Office Action for U.S. Appl. No. 15/738,074, dated Apr. 28, 2020, 8 pages.
Search Report for Chinese Patent Application No. 201680037000.6, dated Nov. 4, 2019, 2 pages.
First Office Action for Chinese Patent Application No. 201680037000.6, dated Dec. 8, 2019, 6 pages.
Zimmer, Rene, PCT International Search Report, PCT/IB2016/053591, EPO, Rijswijk, The Netherlands, dated Sep. 14, 2016.
Written Opinion for International Patent Application No. PCT/IB2016/053591, dated Sep. 14, 2016, 7 pages.
Intention to Grant for European Patent Application No. 16732762.6, dated Sep. 18, 2020, 9 pages.
Summary of Second Office Action for Chinese Patent Application No. 201680037000.6, mailed Jul. 2, 2020, 8 pages.
Third Office Action for Chinese Patent Application No. 201680037011.4, dated Nov. 27, 2020, 10 pages.

* cited by examiner

Figure 10C ions are largely determined by; (1) the quality of the electrical connection to the source, (2) the repeatability of the drain side electrical impedance and (3) the ability to efficiently dissipate large quantities of heat created by the PA.
LOW-COST SUPERIOR PERFORMANCE COINLESS RF POWER AMPLIFIER

TECHNICAL FIELD

The present disclosure relates to power amplifiers and, in particular, mounting of power amplifiers.

BACKGROUND

RF and other High Frequency (HF) Power amplifiers (PA) are a type of semiconductor amplifier used to convert a low-power RF signal into a larger RF signal of significant power, typically for driving the antenna of a transmitter. A PA consists of one or more power transistors mounted inside a semiconductor package to form a PA module. In the present description, the PA module will simply be referred to as a PA. PA transistors increase the power of an output signal (drain) by taking energy from a power supply (source) and controlling the output to match the input signal shape (gate), but with larger amplitude. PA output power ranges from under one watt up to several hundred watts. Methods are used to integrate local heat removal systems such as bonding cooling elements to HF circuit boards. Such local heat removal systems are found in the form of metal coins which are often made of copper. Metal coins can remove heat quickly from the components but result in more complex PCB manufacturing processes.

PA efficiency is a measure of its ability to convert the power supplied into the output signal to power delivered to the antenna. Power that is not converted to useful output signal is dissipated as heat. Typical PA performance factors include; output power, gain, linearity, stability, voltage bias, power efficiency and ruggedness. Performance of PA solutions are largely determined by; (1) the quality of the electrical connection to the source, (2) the repeatability of the drain side electrical impedance and (3) the ability to efficiently dissipate large quantities of heat created by the PA.

Figure 1:
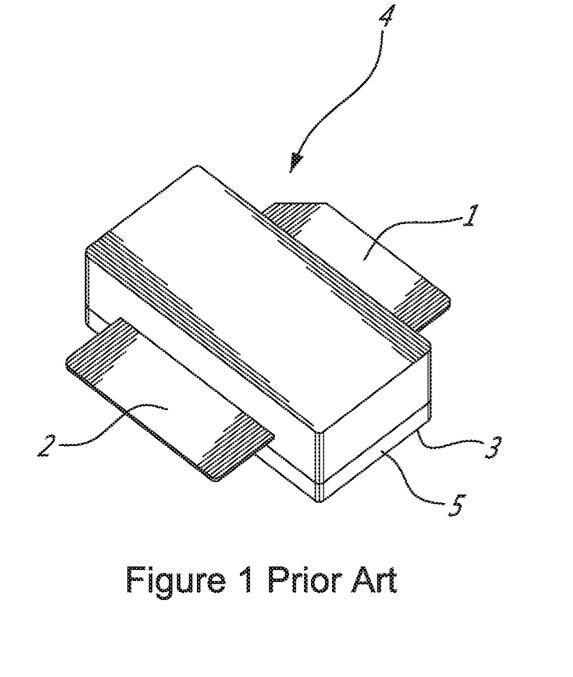
FIG. 1 is a perspective view of a known power amplifier module.
Figure 2:
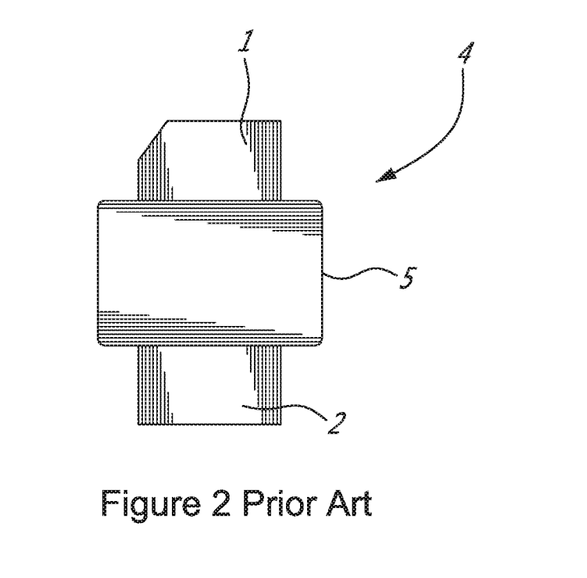
FIG. 2 is a top view of a known power amplifier module.

FIGS. 1 and 2 show a perspective view and a top view, respectively, of a power amplifier module 4. A typical PA module has a drain 1, a gate 2 and a source connection. The source has an electrical connection through the bottom side of the heat slug and a thermal path 3 is between the base of the PA module 4 through the bottom side of heat slug 5. The heat slug 5 is a clad or composite metal material to match thermal expansion and to improve thermal/electrical conductivity to the PA semiconductor die.

Figure 3:
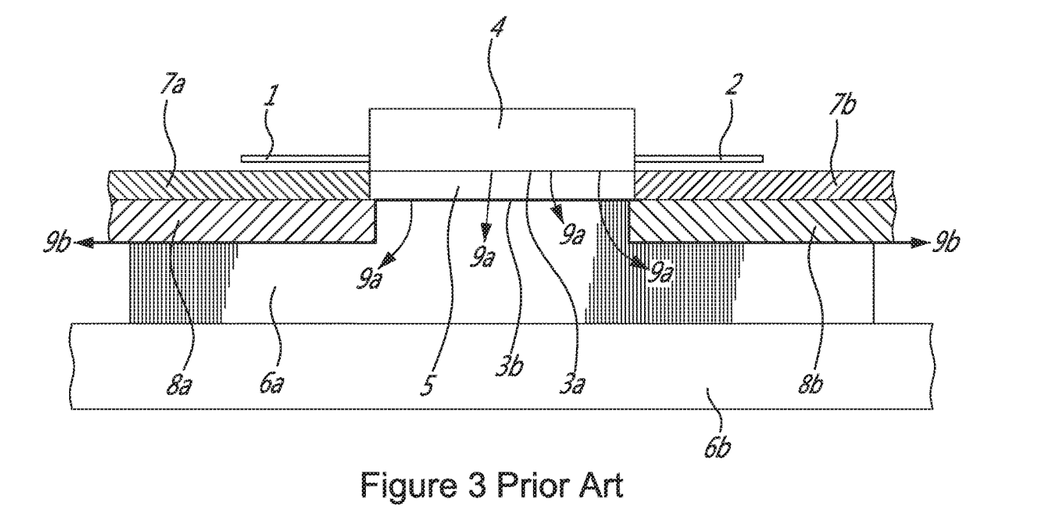
FIG. 3 is a cross sectional view of a known power amplifier assembly.

FIG. 3 shows a sectional view of a known power amplifier 4 mounted on a PCB and utilizing bottom side thermal cooling 9a and electrical connection 9b.

Current PA solutions utilize bottom side electrical and thermal connections through a custom built printed circuit board (PCB). Metal coins (coins) 6a are machined and embedded or attached into the PCB 8a and 8 b. The bottom side of the PA heat slug 5 is physically attached to the coin 6a in the PCB using a paste (not shown).

The interior section of the PA module 4 is not shown for clarity but consists of a ceramic air cavity package with a clad metal Cu/CuMo/Cu heat slug 5. The power transistor and input/output capacitors are die bonded directly onto the heat slug and wire bonded to make electrical connections. The PCB consists of two segments: (1) RF PCBs 7a and 7b which carries RF signals and (2) non-RF PCBs 8a and 8b. Routed cavities and cavity wall plating is used. RF PCBs are typically two layer micro strip designs fabricated with RF material and with the RF GND on the bottom side.

Figure 4:
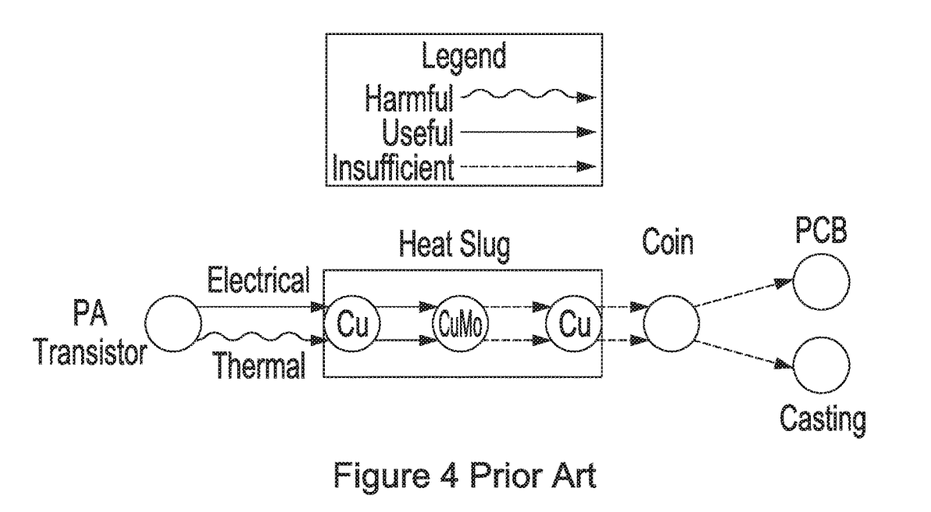
FIG. 4 is a substance field diagram of a known power amplifier assembly.

FIG. 4 is a substance field diagram of a known design, showing that the coin is used for both electrical and thermal conductivity. Current PA solutions are inadequate because of cost, yield and reliability issues. Coins complicate PCB manufacturing with added or repeated process steps necessary for coin fabrication and for creating the cavity plating for RF connection to the PCB ground planes. Added or repeated process steps increase PCB manufacturing cost, lengthen the PCB manufacturing cycle time and impact new product time to market (TTM) for frequency band variants. Furthermore the quality of electrical connections is not ideal. Manufacturing variation in PA placement and the quality of PA attachment to the coin alters PA performance, thereby negatively impacting manufacturing yields.

Current PA solutions suffer from a technical contradiction; if PCB coins are used then adequate PA performance is achieved but PCB manufacturing is difficult, lengthy and costly. If PCB coins are not used then PCB manufacturing is standard, quick and cost effective but PA performance is inadequate.

SUMMARY

Some embodiments include a power amplifier assembly. According to some embodiments, a power amplifier assembly is provided that includes a power amplifier and an extended heat slug. The power amplifier has a gate lead, a drain lead and a source contact surface. The gate lead has a gate contact surface. The drain lead has a drain contact surface. The source contact surface has a source contact surface length and a source contact surface width. The power amplifier has an extended heat slug mounted against the source contact surface to conduct heat away from the surface and to extend the electrical path of the source, the extended heat slug has at least a length that is greater than the length of the source contact surface.

According to this aspect, in some embodiments, the extended heat slug has a width that is substantially greater than the width of the surface. In some embodiments, a portion of the heat slug which extends beyond the width and length of the source contact surface forms with the gate and drain lead contact surfaces, a space for receiving an Radio Frequency (RF) Printed Circuit Board (PCB).

In some embodiments, the extended heat slug is affixed to a die without an intervening coin. In some embodiments, the heat slug includes a slot. In some of these embodiments, the slot is U-shaped. In some embodiments, the heat slug has a plurality of layers, with at least one layer being Cu and another layer being CuMo. In some embodiments, there are two Cu layers, and the CuMo layer is sandwiched between the two Cu layers.

In some embodiments, electrical contact between the power amplifier assembly and the RF PCB is made when the RF PCB is sandwiched between the drain and gate contact surfaces and the extended heat slug. In some embodiments, the electrical and thermal paths are orthogonal. In some embodiments, an electrical path is made between the power amplifier assembly and the RF PCB when the gate contact surface, drain contact surface and the extended heat slug mate with predetermined contact regions of the RF printed circuit board. In some embodiments, the contact regions comprise upper and lower contact surfaces of the RF PCB.

According to another aspect, some embodiments include a power amplifier assembly. In some embodiments, the power amplifier has a housing, a gate lead with a gate contact surface extending away from a first end of said housing, a drain lead with a drain contact surface extending away from a second end of the housing opposite the first end and a source contact surface under the housing, the source contact surface having a length and width. In some embodiments, the power amplifier assembly has an extended heat slug mounted against the source contact surface to conduct heat away from the source contact surface and to extend the electrical path of the source, the extended heat slug has at least a length that is greater than the length of the source contact surface.

According to another aspect, some embodiments include a method for manufacturing a power amplifier assembly. In some embodiments, a method includes adhering a source surface of a power amplifier to an extended heat slug having a dimension greater than the source surface; and affixing the extended heat slug to a housing of the power amplifier assembly.

According to another aspect, some embodiments include an extended heat slug for use with a power amplifier, PA, die, and a printed circuit board, PCB, in which the extended heat slug is one of a clad and a composite material. The one of the clad and the composite material are configured to match the thermal expansion of the PA die and to provide electrical and thermal conductivity. A top is configured to electrically connect to a radio frequency ground on the PCB. A bottom is configured to thermally connect to a metal housing. In accordance with another aspect, the electrical and thermal paths are orthogonal.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Before describing in detail example embodiments that are in accordance with the present disclosure, it is noted that the embodiments reside primarily in combinations of apparatus components and processing steps related to a coinless RF power amplifier. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements The present embodiments eliminate the PCB metal coin, which have up until now been used for local heat removal in HF board designs.

Figure 5:
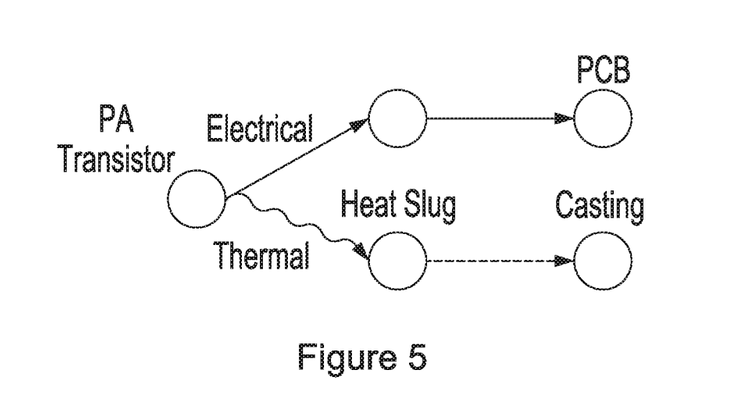
FIG. 5 is a substance field diagram of a power amplifier assembly as described herein.
Figure 6:
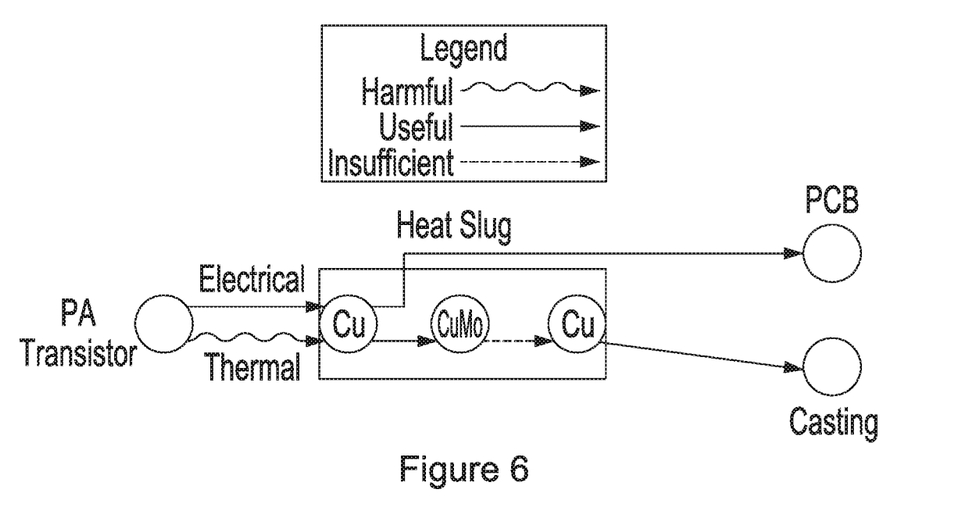
FIG. 6 is another substance field diagram of a power amplifier assembly as described herein.

FIGS. 5 and 6 are substance field diagrams where no coins are used and further decomposition of present embodiments in which the heat slug is a Cu/CuMo/Cu clad material in which the CuMo is sandwiched between the two Cu layers. An electrical connection is made via the heat slug topside clad material, Cu, and can be directly connected to the PA source. Thermal contact or path is through the heat slug and directly to the casting of the radio which serves as a heat sink.

Figures 7A, 7B:
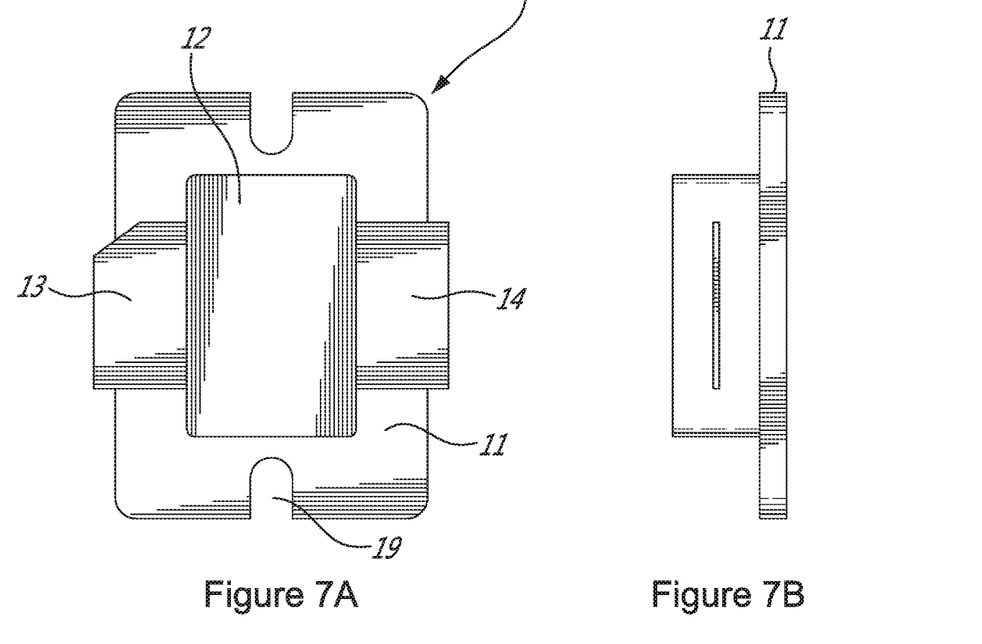
FIGS. 7a, 7b and 7c are top, side and end views of a power amplifier module with an extended heat slug as described herein.
Figure 7C:
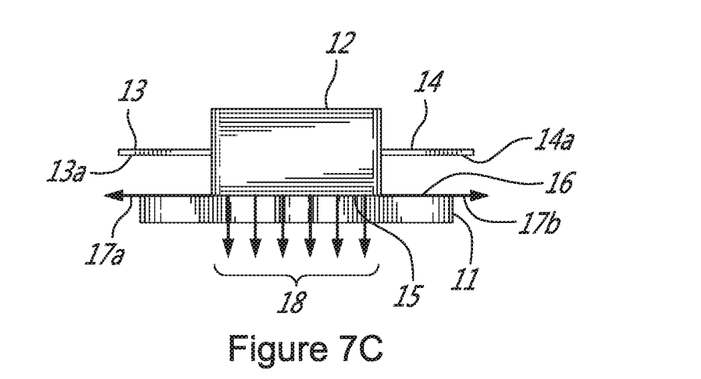

FIGS. 7a, 7b and 7c are top, side and end views of an RF power amplifier assembly 10 with extended heat slug 11 according to one embodiment. In this embodiment, the PA assembly 10 has a housing 12, a drain lead 13 on one end, a gate lead 14 on another end opposite the drain lead 13. The source and its contact surface 15 are located underneath the PA assembly housing 12. Similarly, the drain and gate contact surfaces 13a and 14a are located underneath their respective leads 13 and 14. These contact surfaces are adapted to mate with predetermined contact regions of a Radio Frequency (RF) Printed Circuit Board (PCB) not shown. As will be described further below, this embodiment makes use of a design modification to the heat dissipation and source current flow of the PA housing 12 to achieve superior electrical performance and provide a larger heat conductivity area, with reduced thermal resistance. In FIG. 7a, one design modification is to extend the PA heat slug 11 in length and width beyond the length and width of the PA housing 12. The extended PA heat slug 11 enables coin elimination and improves the quality/repeatability of the electrical connection. For example, extending the outward dimensions of the heat slug 11 by approximately 25% beyond the circumference of the PA housing 12 achieves superior heat flow. This extension not only provides a larger heat contact or dissipation area and superior electrical performance but since the extended surface area of the heat slug 11 is in contact with the source, the source contact area or surface 15 is also increased. Note that the size of the heat slug 11 and in particular, its length, width and thickness will vary according to the electrical and heat dissipation requirements of the PA and PCB designs. Similarly, the preferred size of the heat slug may vary according to manufacturing conditions or performance requirements.

The heat slug 11 of the present PA assembly is designed to provide: (1) direct and ideal connection to the PA source contact surface, (2) improved drain side quality and repeatability of electrical impedance and (3) direct thermal attachment to the radio casting. The heat slug 11 of the current configuration achieves improved PA performance at a greatly reduced cost compared to known solutions. When the heat slug 11 is mated against the source contact surface 15, it has the effect of transferring or extending the source contact surface 15, which is below the PA assembly to the upper surface 16 created with the extended heat slug 11. These changes eliminate the need for difficult, lengthy and costly coins in the PCB with a redesigned PA heat slug to provide an improved thermal path and electrical connection.

The extended heat slug 11 is made from clad or composite materials to match the thermal expansion to the encapsulated PA semiconductor die and housing 12 and provide electrical/thermal conductivity. The source 15 which, in the prior art, would normally be below the PA assembly to connect to the heat slug and metal coin is instead provided at the upper surface of the extended head slug 11. As will be shown further, the electrical connection 17a and 17b to the radio frequency ground (RF GND) on the RF PCB (not shown) is made through the topside of the heat slug 11 with a larger contact area than current solutions. The thermal path 18 is made through the bottom side of the heat slug 11 with a reduced thermal resistance than current solutions. The electrical connections 17a, 17b and thermal path 18 are orthogonal in nature avoiding competition for critical contact area.

The heat slug 11 in contact with the source 15 is a clad (or composite) metal material that makes direct connection to the power transistor(s) source through the PA 4 semiconductor die backside. U-slots 19 in the heat slug enable a mechanical attachment (bolted or equivalent) directly to the radio casting (not shown). A slide and mount or push and twist manufacturing technique is used to attach the PA assembly to the RF PCB(s). This is described in detail in applicant's U.S. application 62/182,987.

Figure 8:
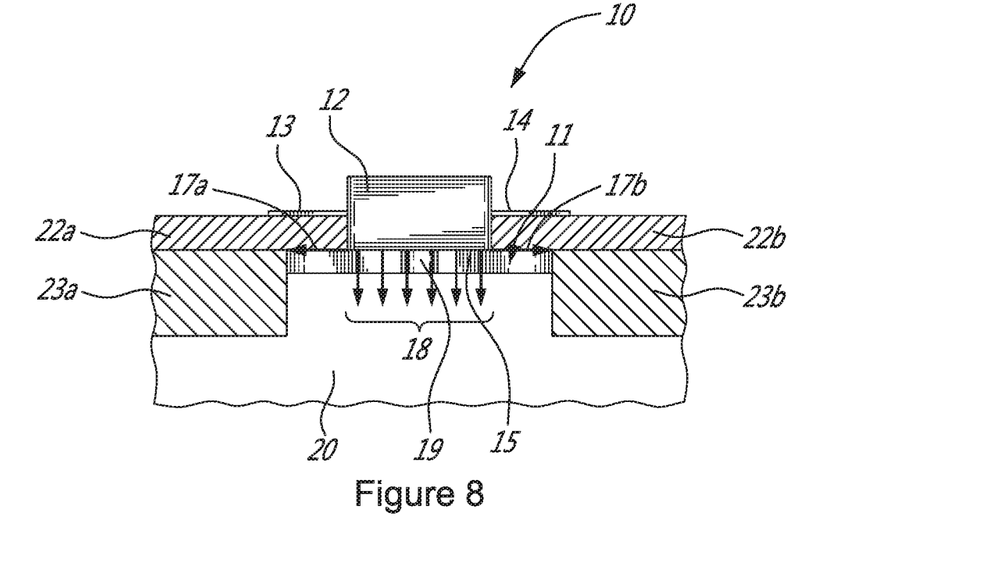
FIG. 8 is a cross sectional view of a power amplifier assembly with an extended heat slug according to one embodiment.

FIG. 8 is cross section of the PA assembly 10 mounted to a casting 20. The PA includes a ceramic ring (not shown) which helps control the vertical spacing between the drain lead 13, gate lead 14 and the extended heat slug and source 15. The ceramic ring thickness is closely matched to the thickness of RF PCB 22a, 22b. Although not shown in FIG. 8, the left and right RF PCB 22a, 22b, and PCB 23a, 23b can be a single PCB or multiple PCBs fabricated from different materials. The PCB may be split or slotted 24 (FIG. 9) to enable slide and mount manufacturing. Slide and mount manufacturing enable smaller RF PCB gaps on the drain and gate sides. It should be noted that although the drawing shows each part tightly adjoining or adjacent each other, an actual cross-section of a manufactured product would show a slight gap between the PCBs 22 and 23 and the PA housing 12 and heat slug 11 to permit manufacturing and assembly of the PA module and PCB. Mechanical tooling pins and fixtures (or simple pattern recognition) can be used to produce repeatable near-zero gaps on the critical drain side. As indicated above, the electrical connections 17a and 17b is made on the overlap between the RF PCB GND and the extended heat slug and the thermal path 18 is made directly through the heat slug to the casting 20. Overlap connection is soldered (or equivalent).

Figure 9:
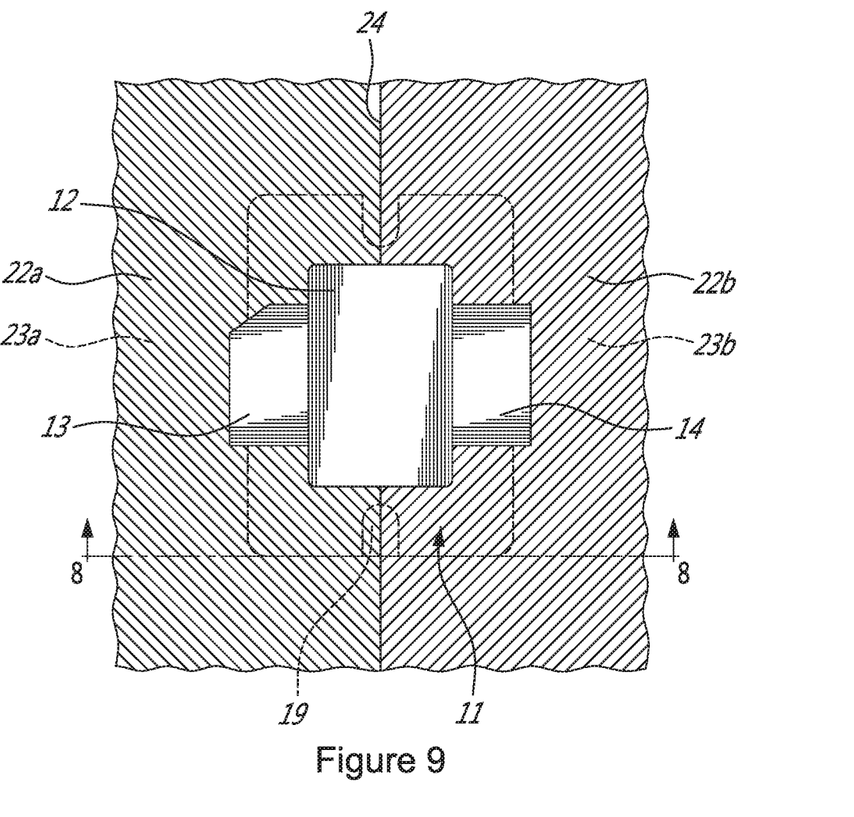
FIG. 9 is a diagram of a top view of a power amplifier assembly with an extended heat slug according to the embodiment of FIG. 8.

FIG. 9 is a top view of the PA assembly 10 in a PCB cavity (not shown) but formed by between the left and right PCBs 22a, 22b, 23a and 23b. The split or divider 24 is along the same axis as the U-Slots 19. Alternatives to U-Slots that achieve direct mechanical connection to the radio casting may be employed. The split PCB enables; (1) slide and mount manufacturing and (2) the use of separate right and left PCB materials to optimize performance and cost. Alternatively a slot enables; (1) slide and mount manufacturing and (2) the use of a single PCB. The split design enables the drain side RF PCB and the gate side RF PCB to be made from different materials.

Figure 10A:
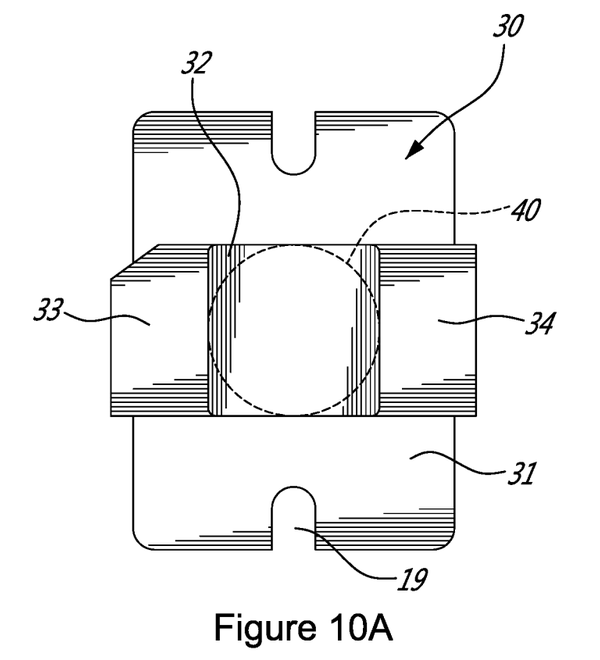
FIGS. 10a, 10b and 10c are top, side and end views of a power amplifier module with an extended heat slug according to another embodiment.
Figure 10B:
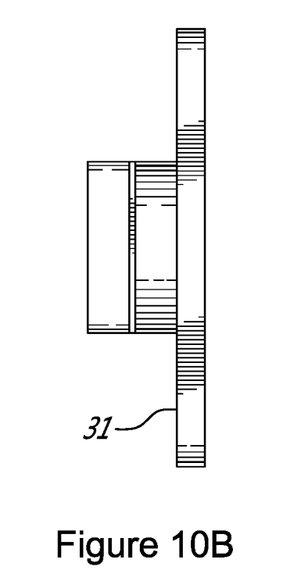
Figure 10C:
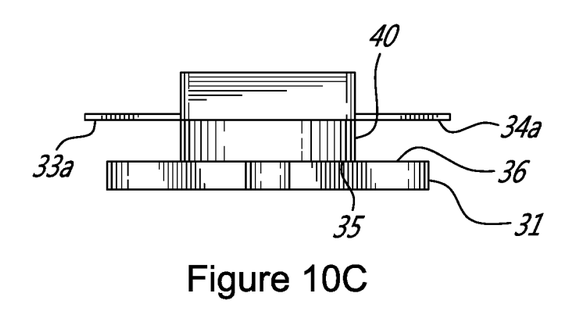

FIGS. 10a, 10b and 10c are top, side and end views of an RF power amplifier assembly 30 with extended heat slug 31 according to another embodiment. In this embodiment, the PA assembly 30 also has a housing 32, a drain lead 33 on one end, a gate lead 34 on another end opposite the drain lead 33. The source and its contact surface 35 are located underneath the PA assembly housing 32. Similarly, the drain and gate contact surfaces 33a and 34a are located underneath their respective leads 34a 33 and 34. These contact surfaces are adapted to mate with predetermined contact regions of a Radio Frequency (RF) Printed Circuit Board (PCB) not shown. In this embodiment, the portion of the housing 40 extending below the drain lead 33 and gate lead 34 is circular, as shown in FIG. 10a. The circular portion of the housing allows for a push and twist manufacturing in a PCB provided with a cavity which matches the shape and circumference of the upper surface of the PA housing 32, drain lead 33 and gate 34 such that when the PA assembly 30 is pushed up through the PCB cavity, the PA assembly can then be twisted or rotated such that the drain lead 33, gate lead 34 and source contact surface 35 on the heat slug 31 can make electrical contact with matching regions of the RF PCB (not shown).

Embodiments eliminate the need for difficult, lengthy and costly manufacturing of coins into the PCB by re-purposing the PA heat slug to provide an improved thermal path and electrical connection. This is realized by; (1) a design modification to extend the length and width of the current PA heat slug and (2) a design modification to PCB to enable slide and mount manufacturing of the PA assembly 20 or the push and twist or rotate of the PA assembly 30.

Advantages of the embodiments described herein include:
Greatly reduced cost over current solutions
Superior electrical performance achieved with improved RF ground connection to the topside of the extended PA heat slug. Larger contact area and connection to the high conductivity heat slug Cu clad metal layer connected directly to the PA transistor die backside (source).
Superior thermal performance. Coin elimination enables direct mechanically clamped thermal path to the casting. Result is reduced thermal resistance.
Improved repeatability. Slide and mount manufacturing enables reduced drain side air gap.
Faster Time to Market (TTM) for frequency band variants. Coinless PCBs has fewer process steps and shortened PCB manufacturing cycle time. Cycle time reduction is >50% over current solutions.
Flexibility. Gate and drain side RF PCBs can be constructed with different materials types to improve performance or reduce costs.

It will be appreciated by persons skilled in the art that the present embodiments are not limited to what has been particularly shown and described herein above. In addition, unless mention was made above to the contrary, it should be noted that all of the accompanying drawings are not to scale. A variety of modifications and variations are possible in light of the above teachings.

We claim:
1. A power amplifier assembly, comprising:
a power amplifier having a gate lead, a drain lead and a source, the gate lead has a gate contact surface, the drain lead has a drain contact surface, the source has a source contact surface comprising a source contact surface length and a source contact surface width;
an electrically and thermally conductive extended heat slug with a planar upper surface, a heat slug length and a heat slug width, the heat slug length being greater than the source contact surface length, the source contact surface being mounted against the planar upper surface of the extended heat slug, side surfaces of the power amplifier and the extended heat slug are surrounded by printed circuit boards; and at least one electrical connection between the power amplifier and a printed circuit board is made along and through the planar upper surface of the extended heat slug, wherein the extended heat slug is configured to:

conduct heat in a direction perpendicular to the source contact surface away from the source contact surface, and extend an electrical path of the source along the planar upper surface of the extended heat slug.

2. The power amplifier assembly of claim 1, wherein said heat slug width is greater than said source contact surface width.

3. The power amplifier assembly of claim 1, wherein said heat slug width is greater than said source contact surface width, and wherein a portion of said extended heat slug which extends beyond said source contact surface width and said source contact surface length forms with said gate contact surface and said drain contact surface, a space for receiving a Radio Frequency (RF), Printed Circuit Board (PCB).

4. The power amplifier assembly of claim 3, wherein said RF PCB is received in said space, and wherein said space is of a width equivalent to a thickness of said RF PCB.

5. The power amplifier assembly of claim 3, wherein the extended heat slug is affixed to a casting without an intervening coin.

6. The power amplifier assembly of claim 3, wherein an electrical path is made between the power amplifier assembly and the RF PBC when said gate contact surface, said drain contact surface and said extended heat slug mate with predetermined contact regions of the RF PCB.

7. The power amplifier assembly of claim 5, wherein said gate contact surface and drain contact surface are underneath said gate lead and said drain lead wherein said source contact surface is extended as said extended heat slug extends beyond said source contact surface width and said source contact surface length of said source contact surface wherein said electrical contact between said power amplifier assembly and said RF PCB is made when said RF PCB is sandwiched between said drain contact surface and said gate contact surface and said planar upper surface of said extended heat slug.

8. The power amplifier assembly of claim 1, wherein said extended heat slug includes a slot.

9. The power amplifier assembly of claim 8, wherein the slot is U-shaped.

10. The power amplifier assembly of claim 1, wherein said extended heat slug has a plurality of layers, with at least one layer being Cu and another layer being CuMo.

11. The power amplifier assembly of claim 10, wherein there are two Cu layers, and the CuMo layer is sandwiched between the two Cu layers.

12. The power amplifier assembly of claim 1, wherein the power amplifier further comprises a housing, wherein the gate contact surface extends away from a first end of said housing, wherein the drain contact surface extends away from a second end of said housing opposite said first end, and wherein the source contact surface is arranged under said housing.

13. The power amplifier assembly of claim 12, wherein the extended heat slug width is greater than the source contact surface width.

14. The power amplifier assembly of claim 13, wherein a portion of the extended heat slug which extends beyond said source contact surface width and said source contact surface length forms with said gate contact surface and said drain contact surfaces, a space for receiving a Radio Frequency (RF), Printed Circuit Board (PCB).

15. The power amplifier assembly of claim 14, wherein said space is equivalent to a thickness of said RF PCB.

16. The power amplifier assembly of claim 14, wherein the extended heat slug is affixed to a casting without an intervening coin.

17. The power amplifier assembly of claim 14, wherein a portion of said housing extending below said gate contact surface and said drain contact surface and extending above said source contact surface is circular.

18. A method for manufacturing a power amplifier assembly, the method comprising:

adhering a source contact surface of a source of a power amplifier to an extended and electrically and thermally conducting heat slug having a planar upper surface and lateral dimensions greater than the source contact surface;

affixing the extended heat slug to a housing of the power amplifier assembly, positioning printed circuit boards to surround sides of the power amplifier housing and the extended heat slug, and connecting the source of the power amplifier to a printed circuit board with at least one connection disposed along and through the planar upper surface of the extended heat slug, wherein the extended heat slug is configured to:

conduct heat in a direction perpendicular to the source contact surface away from the source contact surface, and extend an electrical path of the source in a direction parallel to the source contact surface.

\* \* \* \* \*

UNITED STATES PATENT AND TRADEMARK OFFICE
CERTIFICATE OF CORRECTION

PATENT NO. : 10,912,185 B2  
APPLICATION NO. : 15/526861  
DATED : February 2, 2021  
INVENTOR(S) : Simpson et al.

Page 1 of 1

It is certified that error appears in the above-identified patent and that said Letters Patent is hereby corrected as shown below:

In the Specification

In Column 6, Line 6, delete "34a 33 and 34." and insert -- 33 and 34. --, therefor.

In the Claims

In Column 7, Line 2, in Claim 1, delete "slug," and insert -- slug; --, therefor.

In Column 7, Line 24, in Claim 3, delete "(RF)," and insert -- (RF) --, therefor.

In Column 7, Line 34, in Claim 6, delete "RF PBC" and insert -- RF PCB --, therefor.

In Column 8, Line 19, in Claim 14, delete "(RF)," and insert -- (RF) --, therefor.

In Column 8, Line 39, in Claim 18, delete "assembly," and insert -- assembly; --, therefor.

In Column 8, Line 41, in Claim 18, delete "slug," and insert -- slug; --, therefor.

Signed and Sealed this  
Twenty-ninth Day of June, 2021

Drew Hirshfeld  
*Performing the Functions and Duties of the*  
*Under Secretary of Commerce for Intellectual Property and*  
*Director of the United States Patent and Trademark Office*